(12) United States Patent
Chien

(10) Patent No.: US 10,854,643 B2
(45) Date of Patent: Dec. 1, 2020

(54) DISPLAY PANEL AND DISPLAY APPARATUS

(71) Applicants: HKC Corporation Limited, Shenzhen (CN); Chongqing HKC Optoelectronics Technology Co., Ltd., Chongqing (CN)

(72) Inventor: Chung-Kuang Chien, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 16/349,615

(22) PCT Filed: May 10, 2017

(86) PCT No.: PCT/CN2017/083784
§ 371 (c)(1),
(2) Date: May 14, 2019

(87) PCT Pub. No.: WO2018/201511
PCT Pub. Date: Nov. 8, 2018

(65) Prior Publication Data
US 2019/0348446 A1 Nov. 14, 2019

(30) Foreign Application Priority Data
May 5, 2017 (CN) .......................... 2017 1 0313627

(51) Int. Cl.
*H01L 27/12* (2006.01)
*G02F 1/1343* (2006.01)
(Continued)

(52) U.S. Cl.
CPC ........ *H01L 27/1248* (2013.01); *G02F 1/1368* (2013.01); *G02F 1/13439* (2013.01);
(Continued)

(58) Field of Classification Search
None
See application file for complete search history.

(56) References Cited

U.S. PATENT DOCUMENTS

2006/0082706 A1* 4/2006 Choo ................ G02F 1/133528
349/114
2008/0143939 A1* 6/2008 Adachi ............ G02F 1/133555
349/114
(Continued)

FOREIGN PATENT DOCUMENTS

CN 1763615 A 4/2006
CN 101868510 A 10/2010
(Continued)

OTHER PUBLICATIONS

Yujun Quan, the ISA written comments, dated Feb. 2018, CN.
Yujun Quan, the International Search Report, dated Feb. 2018, CN.

*Primary Examiner* — Steven B Gauthier

(57) ABSTRACT

The present application discloses a display panel and a display apparatus. The display panel includes a substrate, and a plurality of first-layer conducting wires, where each of the first-layer conducting wires is disposed on the substrate, a polarizing color filter layer is disposed on the first-layer conducting wire and forms a color filter film with anisotropy, and the first-layer conducting wire is connected to a column data driver and a pixel driver of the display panel.

18 Claims, 1 Drawing Sheet

(51) Int. Cl.
*G02F 1/1368* (2006.01)
*G02F 1/1335* (2006.01)
*G02F 1/1362* (2006.01)
*G03F 7/004* (2006.01)

(52) U.S. Cl.
CPC .. *G02F 1/133528* (2013.01); *G02F 1/133533* (2013.01); *G02F 1/136286* (2013.01); *G03F 7/004* (2013.01); *H01L 27/1222* (2013.01); *G02F 1/136227* (2013.01); *G02F 2001/136222* (2013.01); *G02F 2001/136295* (2013.01); *G02F 2202/023* (2013.01); *G02F 2202/103* (2013.01)

(56) References Cited

U.S. PATENT DOCUMENTS

2010/0253886 A1* 10/2010 Kim ................ C09D 133/14
 349/96
2016/0334669 A1* 11/2016 Li .................... G02B 5/3025

FOREIGN PATENT DOCUMENTS

| CN | 104330915 A | 2/2015 |
|----|-------------|--------|
| CN | 104765187 A | 7/2015 |
| CN | 104765192 A | 7/2015 |
| CN | 105068296 A | 11/2015 |
| JP | 2016004055 A | 1/2016 |

\* cited by examiner

DISPLAY PANEL AND DISPLAY APPARATUS

The present application claims priority to Chinese Patent Application No. CN2017103136276, filed with the Chinese Patent Office on May 5, 2017, and entitled "DISPLAY PANEL AND DISPLAY APPARATUS", which is incorporated herein by reference in its entirety.

TECHNICAL FIELD

The present application relates to the technical field of displays, and particularly relates to a display panel and a display apparatus.

The descriptions herein provide only background information related to the present application, and do not necessarily constitute the prior art.

BACKGROUND

Liquid crystal display apparatuses have numerous advantages, such as a thin body, power savings, no radiation, and are widely used. Most liquid crystal display apparatuses in the market are backlit liquid crystal display apparatuses, each including a liquid crystal panel and a backlight module. Working principle of the liquid crystal panel is that liquid crystals are put in two parallel glass substrates, and a driving voltage is applied to two glass substrates to control rotation of the liquid crystals, to refract light rays of the backlight module to generate a picture. Thin film transistor liquid crystal display apparatuses (TFT-LCD) maintain a leading status in the display field because of low power consumption, excellent picture quality, high production yield, and other properties. Similarly, the thin film transistor liquid crystal display apparatus includes a liquid crystal panel and a backlight module. The liquid crystal panel includes a color filter substrate (CF substrate), a thin film transistor substrate (TFT), and transparent electrodes on respective inner sides of the above substrates. A layer of liquid crystals (LC) is positioned between two substrates.

With development of thin film transistor liquid crystal display apparatuses towards super large dimension, high driving frequency, high resolution and other aspects, when thin film transistor liquid crystal display apparatuses are manufactured, how to make thin film transistor liquid crystal display apparatuses thinner and how to make manufacturing process simpler not only affect the machining quality and efficiency of display panels, but also decide costs.

SUMMARY

The present application is to provide a display panel and display device, to ensure polarization while reducing process procedures.

To achieve the above objective, the present application provides a display panel, which includes a substrate and a plurality of first-layer conducting wires disposed on the substrate, where a polarizing color filter layer is disposed on the first-layer conducting wire and forms a color filter film with anisotropy, and the first-layer conducting wire is connected to a column data driver and a pixel driver of the display panel.

Optionally, a polymer of 3,4-ethylene dioxythiophene is used as a main body of the polarizing color filter layer, and then functional groups and a photosensitive polymer are added therein. PEDOT is a polymer of 3,4-ethylene dioxythiophene (EDOT) monomers, and PEDOT has the characteristics of simple molecule structure, small energy gap, high electrical conductivity and the like. The photosensitive polymer has the characteristics of short curing time, good performance, low energy consumption and less pollution.

Optionally, the photosensitive polymer is made of polysiloxane acrylate. Polysiloxane acrylate has the characteristics of high photosensitivity, stable storage, simple and convenient synthesis, and various structure types.

Optionally, the photosensitive polymer is made of polyurethane acrylate. Molecules of polyurethane acrylate (PUA) contain acrylic functional groups and urethane bonds, and a cured adhesive has high wear resistance, adhesion, flexibility, high peel strength and excellent low temperature resistance of polyurethane, and excellent optical performance and weather resistance of polyacrylate.

Optionally, the display panel includes a thin film transistor, and the first-layer conducting wire includes a gate conducting wire section disposed on the thin film transistor, where an insulating dielectric layer is disposed on the gate conducting wire section, an amorphous silicon layer corresponding to the gate conducting wire section is disposed on the insulating dielectric layer, an ohmic contact layer corresponding to the amorphous silicon layer is disposed on the amorphous silicon layer, a source electrode and a drain electrode of the thin film transistor are respectively arranged at both ends of the ohmic contact layer, a channel is positioned between the source electrode and the drain electrode, the channel passes through the ohmic contact layer, and the amorphous silicon layer is arranged at the bottom of the channel. The substrate is fully covered by the first-layer conducting wires, and both the gate conducting wire section of the thin film transistor and a connection section between a line scan driver and the gate conducting wire section of the thin film transistor adopt a three-layer structure, so that the overall adhesion of the display panel is better, the quality of the first-layer conducting wires is improved, the product yield is improved, and production cost are reduced.

Optionally, the first-layer conducting wire includes a source conducting wire section and a drain conducting wire section which are disposed on the thin film transistor, where a polarizing color filter layer is disposed on the source conducting wire section and the drain conducting wire section, a pixel electrode layer is disposed on the polarizing color filter layer, the polarizing color filter layer is provided with a via hole corresponding to the drain conducting wire section, and the pixel electrode layer is connected to the drain conducting wire section through the via hole. Up and down positions of the polarizing color filter layer are defined.

Optionally, the polarizing color filter layer is sputtered on the first-layer conducting wire using chemical vapor deposition. In the chemical vapor deposition (CVD) method, a vapor reaction at a high temperature is developed as a means of coatings, which is not only applied to coatings of heat-resistant material, but also is applied to refining of high purity metal, powder synthesis, semiconductor films and the like. The deposition temperature is low, film compositions are easy to control, the film thickness is in direct proportion to the deposition time, the uniformity and repeatability are good, and the step coverage is excellent.

Optionally, a pixel electrode layer is disposed on the polarizing color filter layer, and the pixel electrode layer is directly sputtered and etched on the polarizing color filter layer. After the polarizing color filter layer is irradiated by polarized ultraviolet light, a photochemical reaction occurs to the photosensitive polymer to form a color filter film with anisotropy, and meanwhile, the color filter film has the characteristic of resisting Indium tin oxide (ITO) sputtering and etching.

According to another aspect of the present application, the present application further discloses a display apparatus including a backlight module and the above display panel.

Optionally, the backlight module includes a polarizer, the display panel includes a thin film transistor array substrate and a color filter substrate, and the polarizer is only arranged at one side of the color filter substrate. Because the display panel has a polarizing function at one side of the thin film transistor array substrate, the polarizer required to be adhered at the TFT side after cell pairing may be omitted, thereby achieving the purposes of reducing manufacturing processes and saving costs.

Optionally, the insulating dielectric layer is made of a nitrogen silicone compound.

Optionally, the insulating dielectric layer includes nanometer porous silicon, and the nanometer porous silicon includes a plurality of hollow columnar subassemblies, where each subassembly has a section in hexagon; the subassembly is including a circular hole in the middle, the circular hole includes a plurality of silicon holes and the silicon holes includes a germanium nanometer particle.

In the present application, because the polarizing color filter film has a dielectric property barrier layer function and a polarizing effect required by a protective layer of the thin film transistor, steps in the manufacturing process of the display panel and the step of adhering the polarizer at one side of the display apparatus after pairing may be omitted, thereby reducing processes and reducing costs.

BRIEF DESCRIPTION OF DRAWING

The drawings included are used for providing further understanding of embodiments of the present application, constitute part of the description, are used for illustrating implementation manners of the present application, and interpreting principles of the present application together with text description. Apparently, the drawings in the following description are merely some embodiments of the present application, and for those of ordinary skill in the art, other drawings can also be obtained according to the drawings without contributing creative labor. In the drawings.

DETAILED DESCRIPTION

Figure 1:
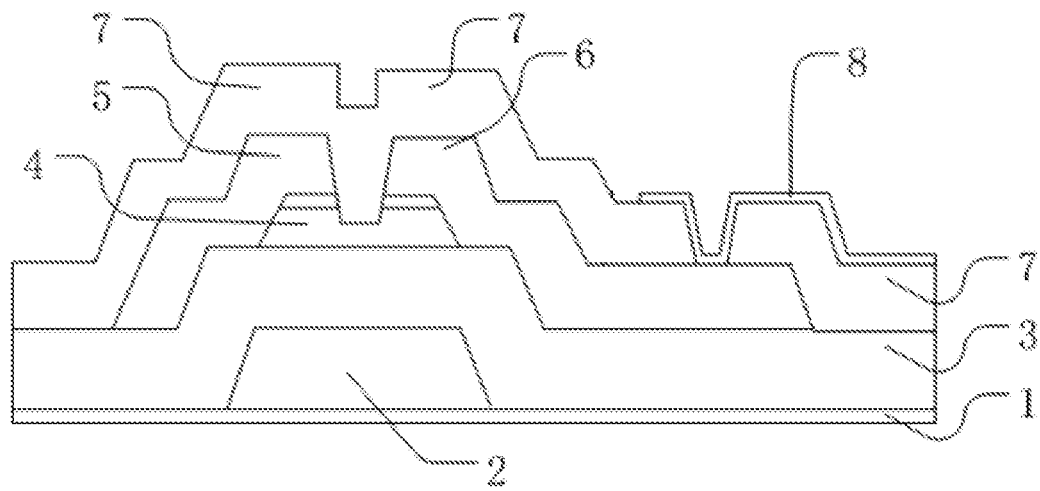
FIG. 1 is a schematic diagram of a thin film transistor of a display panel of an embodiment of the present application.

Specific structure and function details disclosed herein are only representative and are used for the purpose of describing exemplary embodiments of the present application. However, the present application may be specifically achieved in many alternative forms and shall not be interpreted to be only limited to the embodiments described herein.

It should be understood in the description of the present application that terms such as "central", "horizontal", "upper", "lower", "left", "right", "vertical", "horizontal", "top", "bottom", "inner", "outer", etc. indicate direction or position relationships shown based on the drawings, and are only intended to facilitate the description of the present application and the simplification of the description rather than to indicate or imply that the indicated apparatus or element must have a specific direction or constructed and operated in a specific direction, and therefore, shall not be understood as a limitation to the present application. In addition, the terms such as "first" and "second" are only used for the purpose of description, rather than being understood to indicate or imply relative importance or hint the number of indicated technical features. Thus, the feature limited by "first" and "second" can explicitly or impliedly comprise one or more features. In the description of the present application, the meaning of "a plurality of" is two or more unless otherwise specified. In addition, the term "comprise" and any variant are intended to cover non-exclusive inclusion.

It should be noted in the description of the present application that, unless otherwise specifically regulated and defined, terms such as "installation" "bonded," and "bonding" shall be understood in broad sense, and for example, may refer to fixed bonding or detachable bonding or integral bonding, may refer to mechanical bonding or electrical bonding, and may refer to direct bonding or indirect bonding through an intermediate medium or inner communication of two elements. For those of ordinary skill in the art, the meanings of the above terms in the present application may be understood according to concrete conditions.

The terms used herein are intended to merely describe specific embodiments, not to limit the exemplary embodiments. Unless otherwise noted clearly in the context, singular forms "one" and "single" used herein are also intended to comprise plurals. It should also be understood that the terms "comprise" and/or "include" used herein specify the existence of stated features, integers, steps, operation, units and/or assemblies, not excluding the existence or addition of one or more other features, integers, steps, operation, units, assemblies and/or combinations of these.

This application is described below with reference to the accompanying drawings and optional embodiments.

In one embodiment of the present application, the display panel includes a substrate 1, and a plurality of first-layer conducting wires, where each of the first-layer conducting wires is disposed on the substrate 1, a polarizing color filter layer 7 is disposed on the first-layer conducting wire and forms a color filter film with anisotropy, and the first-layer conducting wire is connected to a column data driver and a pixel driver of the display panel. In the present application, because the polarizing color filter film has a dielectric property barrier layer function and a polarizing effect required by a protective layer of the thin film transistor, steps in the manufacturing process of the display panel and the step of adhering the polarizer 9 at one side of the display apparatus after pairing may be omitted, thereby reducing processes and reducing costs.

In another embodiment of the present application, a polymer of 3,4-ethylene dioxythiophene is used as a main body of the polarizing color filter layer 7, and then functional groups and a photosensitive polymer are added therein. Because the polarizing color filter film has a dielectric property barrier layer function and a polarizing effect required by a protective layer of the thin film transistor, steps in the manufacturing process of the display panel and the step of adhering the polarizer 9 at one side of the display apparatus after pairing may be omitted, thereby reducing processes and reducing costs. PEDOT is a polymer of 3,4-ethylene dioxythiophene (EDOT) monomers, and PEDOT has the characteristics of simple molecule structure, small energy gap, high electrical conductivity and the like. The photosensitive polymer has the characteristics of short curing time, good performance, low energy consumption and less pollution.

In another embodiment of the present application, the photosensitive polymer is made of polysiloxane acrylate. Because the polarizing color filter film has a dielectric property barrier layer function and a polarizing effect required by a protective layer of the thin film transistor, steps in the manufacturing process of the display panel and the step of adhering the polarizer 9 at one side of the display apparatus after pairing may be omitted, thereby reducing processes and reducing costs. PEDOT is a polymer of 3,4-ethylene dioxythiophene (EDOT) monomers, and PEDOT has the characteristics of simple molecule structure, small energy gap, high electrical conductivity and the like. The photosensitive polymer has the characteristics of short curing time, good performance, low energy consumption and less pollution. Polysiloxane acrylate has the characteristics of high photosensitivity, stable storage, simple and convenient synthesis, and various structure types.

In another embodiment of the present application, the photosensitive polymer is made of polyurethane acrylate. Because the polarizing color filter film has a dielectric property barrier layer function and a polarizing effect required by a protective layer of the thin film transistor, steps in the manufacturing process of the display panel and the step of adhering the polarizer 9 at one side of the display apparatus after pairing may be omitted, thereby reducing processes and reducing costs. PEDOT is a polymer of 3,4-ethylene dioxythiophene (EDOT) monomers, and the PEDOT has the characteristics of simple molecule structure, small energy gap, high electrical conductivity and the like. The photosensitive polymer has the characteristics of short curing time, good performance, low energy consumption and less pollution. Molecules of polyurethane acrylate (PUA) contain acrylic functional groups and urethane bonds, and a cured adhesive has high wear resistance, adhesion, flexibility, high peel strength and excellent low temperature resistance of polyurethane, and excellent optical performance and weather resistance of polyacrylate. The photosensitive polymer may be other polymer which is sensitive to light and of which the structure or nature may make a certain significant change under the action of light, for example, aminoacrylic acid (having light color, low viscosity, excellent chemical resistance, good weather resistance, and good coating wear resistance); tripropylene glycol diacrylate (a familiar acrylic acid derivative monomer, used as a crosslinking agent in light curing or radiation curing, to reduce radiation doses; used as an activated thinner, to obviously reduce viscosity of a resin system); hydroxypropyl acrylate (configured to prepare adhesives, thermosetting coatings, fiber finishing agents and synthetic resin copolymer modifiers, and also configured to prepare lubricating oil additives and the like; as a functional monomer, used as a crosslinking monomer of acrylic resin, to improve adhesion, weather resistance, chemical resistance, impact resistance and gloss of products; configured to prepare synthetic resin, adhesives, thermosetting coatings and the like; and also configured to prepare fiber finishing agents, rubber latex, printing ink, medical material and the like).

In another embodiment of the present application, as shown in FIG. 1 which is a schematic diagram of a thin film transistor of an embodiment of the present application, the display panel includes a thin film transistor, and the first-layer conducting wire includes a gate conducting wire section disposed on the thin film transistor, where an insulating dielectric layer 3 is disposed on the gate conducting wire section, an amorphous silicon layer corresponding to the gate conducting wire section is disposed on the insulating dielectric layer 3, an ohmic contact layer corresponding to the amorphous silicon layer is disposed on the amorphous silicon layer, a source electrode 5 and a drain electrode 6 of the thin film transistor are respectively arranged at both ends of the ohmic contact layer, a channel is positioned between the source electrode 5 and the drain electrode 6, the channel passes through the ohmic contact layer, and the amorphous silicon layer is arranged at the bottom of the channel. The substrate 1 is fully covered by the first-layer conducting wires, and both the gate conducting wire section of the thin film transistor and a connection section between a line scan driver and the gate conducting wire section of the thin film transistor adopt a three-layer structure, so that the overall adhesion of the display panel is better, the quality of the first-layer conducting wires is improved, the product yield is improved, and production cost are reduced. A gate electrode 2 (Gate) adopts the form of plating aluminum (Al) and molybdenum (Mo). As a channel layer, the amorphous silicon layer may be made of amorphous silicon, and of course, may be made of other semiconductor layer materials as well. The ohmic contact layer is made of high-concentration phosphorus silicon to reduce interface potential difference. The source electrode 5 (Source) and the drain electrode 6 (Drain) are made of molybdenum (Mo) and aluminum (Al). Aluminum is light in weight and resistant to corrosion, is rich in resources, and is widely used because of light weight, good electrical conductivity and thermal conductivity, high reflectivity and oxidation resistance. Molybdenum or molybdenum alloy realizes good adhesion, may be well adhered to metal such as copper, aluminum, silver, gold, chromium, molybdenum and the like of an intermediate conducting layer on the one hand, and may be well adhered to other layer such as the substrate, the color filter layer, the insulation layer or the like of the display panel on the other hand. The material is conveniently selected, and the manufacturing technology is mature. No additional raw material is required, thereby reducing raw materials cost and storage cost, no new material is required to be added to a material list, thereby facilitating flow management and purchase, and no additional equipment is required to arrange a second high-adhesion metal layer sharing one equipment with a first high-adhesion metal layer, and no additional equipment and material are required for later etching.

The insulating dielectric layer 3 is made of a nitrogen silicone compound (SiNx), i.e. a nitrogen silicon compound. A polymer of 3,4-ethylene dioxythiophene may also be used as a main body of the insulating dielectric layer 3, and then functional groups and a photosensitive polymer are added therein. PEDOT is a polymer of 3,4-ethylene dioxythiophene monomers (EDOT), and PEDOT has the characteristics of simple molecule structure, small energy gap, high electrical conductivity and the like. The photosensitive polymer has the characteristics of short curing time, good performance, low energy consumption and less pollution. The photosensitive polymer is made of polysiloxane-acrylate. Polysiloxane acrylate has the characteristics of high photosensitivity, stable storage, simple and convenient synthesis, and various structure types. The photosensitive polymer is made of polyurethane acrylate. Molecules of polyurethane acrylate (PUA) contain acrylic functional groups and urethane bonds, and a cured adhesive has high wear resistance, adhesion, flexibility, high peel strength and excellent low temperature resistance of polyurethane, and excellent optical performance and weather resistance of polyacrylate. The insulating dielectric layer 3 includes nanometer porous silicon, and the nanometer porous silicon includes a plurality of hollow columnar subassemblies, where each subassembly has a section in hexagon, the subassembly is provided with a circular through hole in the middle, a plurality of silicon holes are provided in the circular through hole of the subassembly, and germanium nanometer particles are provided in the silicon holes. The hexagon of the section of the subcomponent of porous silicon facilitates splicing and arrangement of a plurality of subcomponents. A plurality of germanium nanometer particles are provided in the silicon holes, the thickness of porous silicon is not affected.

Specifically, the first-layer conducting wire includes a source conducting wire section and a drain conducting wire section which are disposed on the thin film transistor, where a polarizing color filter layer 7 is disposed on the source conducting wire section and the drain conducting wire section, a pixel electrode layer 8 is disposed on the polarizing color filter layer 7, the polarizing color filter layer 7 is provided with a via hole corresponding to the drain conducting wire section, and the pixel electrode layer 8 is connected to the drain conducting wire section through the via hole. A polymer of 3,4-ethylene dioxythiophene is used as a main body of the polarizing color filter layer 7, and then functional groups and a photosensitive polymer are added therein. PEDOT is a polymer of 3,4-ethylene dioxythiophene (EDOT) monomers, and the PEDOT has the characteristics of simple molecule structure, small energy gap, high electrical conductivity and the like. The photosensitive polymer has the characteristics of short curing time, good performance, low energy consumption and less pollution. The photosensitive polymer is made of polysiloxane acrylate. Polysiloxane acrylate has the characteristics of high photosensitivity, stable storage, simple and convenient synthesis, and various structure types. The photosensitive polymer is made of polyurethane acrylate. Molecules of polyurethane acrylate (PUA) contain acrylic functional groups and urethane bonds, and a cured adhesive has high wear resistance, adhesion, flexibility, high peel strength and excellent low temperature resistance of polyurethane, and excellent optical performance and weather resistance of polyacrylate. Because the polarizing color filter film has a dielectric property barrier layer function and a polarizing effect required by a protective layer of the thin film transistor, steps in the manufacturing process of the display panel and the step of adhering the polarizer 9 at one side of the display apparatus after pairing may be omitted, thereby reducing processes and reducing costs.

In another embodiment of the present application, in the manufacturing process, the polarizing color filter layer 7 is sputtered on the first-layer conducting wire using chemical vapor deposition. In the chemical vapor deposition (CVD) method, a vapor reaction at a high temperature is developed as a means of coatings, which is not only applied to coatings of heat-resistant material, but also is applied to refining of high purity metal, powder synthesis, semiconductor films and the like. The deposition temperature is low, film compositions are easy to control, the film thickness is in direct proportion to the deposition time, the uniformity and repeatability are good, and the step coverage is excellent. The chemical vapor deposition (CVD) method has the technical characteristics that high-melting-point substances synthetized at a low temperature; precipitated substances are in various forms such as single crystal form, polycrystal form, crystal whisker form, powder form, thin film form and the like; and not only coating may be performed on the substrate, but also coating may be performed on the powder surface. Especially, the technology of synthetizing high-melting-point substances at a low temperature makes a contribution in the energy saving aspect, and has a bright future as a new technology. A pixel electrode layer 8 is disposed on the polarizing color filter layer 7, and the pixel electrode layer 8 is directly sputtered and etched on the polarizing color filter layer 7. After the polarizing color filter layer 7 is irradiated by polarized ultraviolet light, a photochemical reaction occurs to the photosensitive polymer to form a color filter film with anisotropy, and meanwhile, the color filter film has the characteristic of resisting ITO sputtering and etching.

Figure 2:
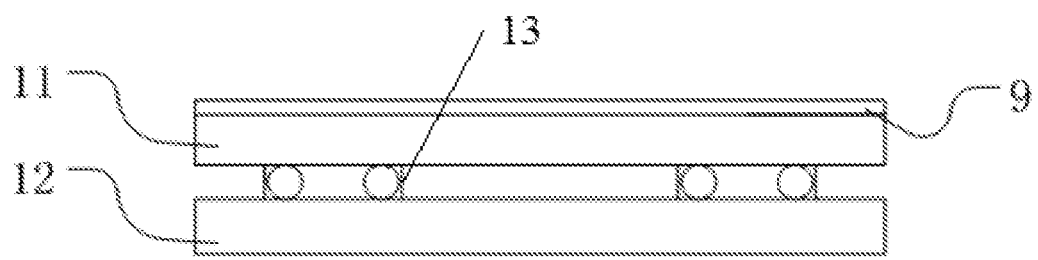
FIG. 2 is a schematic diagram of a display apparatus of an embodiment of the present application.

In another embodiment of the present application, FIG. 2 shows a display apparatus of an embodiment of the present application. The display apparatus includes a backlight module and the above display panel.

Specifically, the backlight module includes a polarizer 9, the display panel includes a thin film transistor array substrate 12 and a color filter substrate 11, and the polarizer 9 is only arranged at one side of the color filter substrate 11. Because the display panel has a polarizing function at one side of the thin film transistor array substrate 12, the polarizer 9 required to be adhered at the TFT side after cell pairing may be omitted, thereby achieving the purposes of reducing manufacturing processes and saving costs.

It should be noted that in the above embodiment, the substrate 1 may be made of glass, plastic or the like.

In the above embodiment, the display panel includes a liquid crystal panel, an organic light-emitting diode (OLED) panel, a curved surface type panel, a plasma panel and the like. In taking the liquid crystal panel as an example, the liquid crystal panel includes an array substrate and a color filter substrate 11 (CF substrate), where the array substrate and the color filter substrate 11 are arranged opposite to each other, liquid crystals and photo spacers (PS) 13 are positioned between the array substrate and the color filter substrate 11, a thin film transistor (TFT) is disposed on the array substrate, and a color filter layer is disposed on the color filter substrate 11.

In the above embodiment, the color filter substrate 11 may include a TFT array, a color filter and the TFT array may be formed on the same substrate 1, and the array substrate may include the color filter layer.

In the above embodiment, the display panel of the present application may be a curved surface type panel.

The foregoing content is merely detailed descriptions of this application made with reference to specific optional implementations, and should not be considered limiting of specific implementations of this application. Persons of ordinary skill in the art can further make simple deductions or replacements without departing from the concept of this application, and such deductions or replacements should all be considered as falling within the protection scope of this application.

What is claimed is:
1. A display panel, comprising:
 a substrate; and
 a plurality of first-layer conducting wires disposed on the substrate, wherein a polarizing color filter layer is disposed on the first-layer conducting wires and forms a color filter film with anisotropy, and the first-layer conducting wires are connected to a column data driver and a pixel driver of the display panel;
 wherein a polymer of 3,4-ethylene dioxythiophene is used as a main body of the polarizing color filter layer, and then functional groups and a photosensitive polymer are added therein;
 wherein the photosensitive polymer is made of polysiloxane-acrylate or polyurethane acrylate; and the display panel comprises a thin film transistor, and the first-layer conducting wires comprises a gate conducting wire section disposed on the thin film transistor, wherein an insulating dielectric layer is disposed on the gate conducting wire section, an amorphous silicon layer corresponding to the gate conducting wire section is disposed on the insulating dielectric layer, an ohmic contact layer corresponding to the amorphous silicon layer is disposed on the amorphous silicon layer, a source electrode and a drain electrode of the thin film transistor are respectively arranged at both ends of the ohmic contact layer, a channel is positioned between the source electrode and the drain electrode, the channel passes through the ohmic contact layer, the amorphous silicon layer is arranged at the bottom of the channel;

wherein the polarizing color filter layer is directly disposed on the source electrode and the drain electrode, a pixel electrode layer is disposed on the polarizing color filter layer, the polarizing color filter layer is provided with a via hole corresponding to the drain electrode, and the pixel electrode layer is connected to the drain electrode through the via hole;

wherein the pixel electrode layer is disposed on the polarizing color filter layer, and the pixel electrode layer is directly sputtered and etched on the polarizing color filter layer.

2. A display panel, comprising:

a substrate; and a plurality of first-layer conducting wires disposed on the substrate, wherein a polarizing color filter layer is disposed on the first-layer conducting wires and forms a color filter film with anisotropy, and the first-layer conducting wires are connected to a column data driver and a pixel driver of the display panel;

a thin film transistor comprising a gate electrode, an insulating dielectric layer disposed on the gate electrode, an amorphous silicon layer corresponding to the gate electrode disposed on the insulating dielectric layer, an ohmic contact layer corresponding to the amorphous silicon layer disposed on the amorphous silicon layer, a source electrode, and a drain electrode, wherein the source electrode and the drain electrode of the thin film transistor are respectively arranged at both ends of the ohmic contact layer; and the polarizing color filter layer is directly disposed on the source electrode and the drain electrode.

3. The display panel according to claim 2, wherein a polymer of 3,4-ethylene dioxythiophene is used as a main body of the polarizing color filter layer, and then functional groups and a photosensitive polymer are added therein.

4. The display panel according to claim 3, wherein the photosensitive polymer is made of polysiloxane acrylate.

5. The display panel according to claim 3, wherein the photosensitive polymer is made of polyurethane acrylate.

6. The display panel according to claim 2, wherein a channel is positioned between the source electrode and the drain electrode, the channel passes through the ohmic contact layer, and the amorphous silicon layer is arranged at the bottom of the channel.

7. The display panel according to claim 6, wherein a pixel electrode layer is disposed on the polarizing color filter layer, the polarizing color filter layer is provided with a via hole corresponding to the drain electrode, and the pixel electrode layer is connected to the drain electrode through the via hole.

8. The display panel according to claim 7, wherein a polymer of 3, 4-ethylene dioxythiophene is used as a main body of the polarizing color filter layer, and then functional groups and a photosensitive polymer are added therein, the photosensitive polymer is made of polyurethane acrylate or polysiloxane acrylate.

9. The display panel according to claim 6, wherein the insulating dielectric layer is made of a nitrogen silicone compound.

10. The display panel according to claim 2, wherein the polarizing color filter layer is sputtered on the first-layer conducting wires using chemical vapor deposition.

11. The display panel according to claim 10, wherein a pixel electrode layer is disposed on the polarizing color filter layer, and the pixel electrode layer is directly sputtered and etched on the polarizing color filter layer.

12. A display apparatus, wherein the display apparatus comprises a backlight module and a display panel, the display panel comprises:

a substrate; and a plurality of first-layer conducting wires disposed on the substrate, wherein a polarizing color filter layer is disposed on the first-layer conducting wires and forms a color filter film with anisotropy, and the first-layer conducting wires are connected to a column data driver and a pixel driver of the display panel; and a polymer of 3,4-ethylene dioxythiophene is used as a main body of the polarizing color filter layer, and then functional groups and a photosensitive polymer are added therein, and the photosensitive polymer is made of polyurethane acrylate or polysiloxane acrylate.

13. The display apparatus according to claim 12, wherein the display panel comprises a polarizer, the display panel comprises a thin film transistor array substrate and a color filter substrate, and the polarizer is only arranged at one side of the color filter substrate.

14. The display apparatus according to claim 12, wherein the display panel comprises a thin film transistor, and the first-layer conducting wires comprise a gate conducting wire section disposed on the thin film transistor; wherein an insulating dielectric layer is disposed on the gate conducting wire section, an amorphous silicon layer corresponding to the gate conducting wire section is disposed on the insulating dielectric layer, an ohmic contact layer corresponding to the amorphous silicon layer is disposed on the amorphous silicon layer, a source electrode and a drain electrode of the thin film transistor are respectively arranged at both ends of the ohmic contact layer, a channel is positioned between the source electrode and the drain electrode, the channel passes through the ohmic contact layer, and the amorphous silicon layer is arranged at the bottom of the channel.

15. The display apparatus according to claim 14, wherein the polarizing color filter layer is disposed on the source electrode and the drain electrode, a pixel electrode layer is disposed on the polarizing color filter layer, the polarizing color filter layer is provided with a via hole corresponding to the drain electrode, and the pixel electrode layer is connected to the drain electrode through the via hole.

16. The display apparatus according to claim 12, wherein the photosensitive polymer is made of polysiloxane acrylate.

17. The display apparatus according to claim 12, wherein the photosensitive polymer is made of polyurethane acrylate.

18. The display apparatus according to claim 12, wherein the display panel further comprises a thin film transistor comprising a gate electrode, an insulating dielectric layer disposed on the gate electrode, an amorphous silicon layer corresponding to the gate electrode disposed on the insulating dielectric layer, an ohmic contact layer corresponding to the amorphous silicon layer disposed on the amorphous silicon layer, a source electrode, and a drain electrode, wherein the source electrode and the drain electrode of the thin film transistor are respectively arranged at both ends of the ohmic contact layer; and the polarizing color filter layer is directly disposed on the source electrode and the drain electrode.

\* \* \* \* \*